United States Patent [19]

Morio

[11] 4,247,880
[45] Jan. 27, 1981

[54] IGNITION DEVICE FOR OIL BURNERS

[75] Inventor: Shuji Morio, Yokohama, Japan

[73] Assignee: Yamatake-Honeywell Company Limited, Tokyo, Japan

[21] Appl. No.: 11,278

[22] Filed: Feb. 12, 1979

[30] Foreign Application Priority Data

Feb. 28, 1978 [JP]  Japan ................................. 53-231401

[51] Int. Cl.³ ............................................. F23Q 3/00
[52] U.S. Cl. ............................ 361/256; 315/209 CD; 315/209 SC
[58] Field of Search .................. 315/209 CD, 209 SC; 361/256

[56] References Cited

U.S. PATENT DOCUMENTS

| | | | |
|---|---|---|---|
| 3,523,211 | 8/1970 | Oishi et al. | 315/209 CD |
| 3,665,908 | 5/1972 | Oishi | 315/209 CD |
| 3,824,429 | 7/1974 | Davalillo | 315/209 CD |
| 3,849,670 | 11/1974 | Lourigan | 361/256 |
| 3,980,922 | 9/1976 | Katsumata et al. | 315/209 CD |
| 4,001,638 | 1/1977 | Bauer et al. | 315/209 CD |

FOREIGN PATENT DOCUMENTS 1009560  11/1965  United Kingdom .

Primary Examiner—C. C. Shaw
Attorney, Agent, or Firm—Alfred N. Feldman

[57] ABSTRACT

An oil burner ignition circuit using a relaxation oscillator is disclosed. The step-up transformer has a tertiary winding magnetically coupled to a primary winding. The tertiary winding and a diode controls the dissipation in the circuit, and the recovery of energy to a capacitor of the relaxation oscillator.

3 Claims, 8 Drawing Figures

IGNITION DEVICE FOR OIL BURNERS

BACKGROUND OF THE INVENTION

In general, spark electrodes of an ignition device for oil burners become coated with sprayed oil or combustion residue, so it is desirable that the spark electrodes are arranged at a position away from the sprayed fuel by a given distance and that the spark generated across the electrodes is transferred to the fuel by an air flow. As a result, the ignition device is required to generate a spark having a high power output, to reduce a loss induced by heat accumulated in circuit elements, and to effect a continuous operation for a long time period.

In order to satisfy such requirements, heretofore, it has been the common practice to provide an ignition device for internal combustion engines which is provided with a circuit constructed and arranged as shown in FIGS. 1(a) and 2(a). The ignition device shown in FIG. 1(a) is a prior art technique described in the U.S. Pat. No. 3,523,211. In FIG. 1(a), reference numeral 20 designates a direct current-direct current converter including a direct current source therein; a charging and discharging capacitor 4 connected in parallel with a series circuit including a silicon controlled rectifier 5 and a primary winding 12 of an ignition transformer 11 and also connected in parallel with a series circuit including a choke coil 13 and a diode 16; a secondary winding 14 of the ignition transformer 11; and 17 spark electrodes connected across the secondary winding 14.

As shown in FIG. 1(b), in such a prior art ignition device, if the silicon controlled rectifier 5 is caused to conduct at a time $t=t_o$, the charge of the capacitor 4, which has been charged with polarities shown in FIG. 1(a), becomes discharged through the primary winding 12 and the silicon controlled rectifier 5 up to a time $t=t_1$. The discharge continues even after the time $t_1$ and begins to charge the capacitor 4 with polarities which are opposite to the polarities shown in FIG. 1(a) for a short time. During a short time between a time $t_o$ and this stage, a pulse of current flow in the primary winding 12 to generate a high voltage at the secondary winding 14 of the ignition transformer 11, thereby producing sparks across the spark electrodes 17. Such a conventional ignition device has the major drawback that after the time $t_1$, the electromotive force which is opposed to the electromotive force induced in the primary winding 12 up to the time $t_1$ is induced in the primary winding 12. As a result, a current $i_s$ flows again from the primary winding 12 through the silicon controlled rectifier 5, diode 16 and choke coil 13 to the primary winding 12. The current $i_s$ is a forwardly conductive current which functions to instantaneously eliminate some of the magnetic energy of the primary winding 12, thereby not only reducing the amount of charge to be stored in the capacitor 4 in the opposite direction, but also rendering the rise time of the voltage between the anode and cathode of the silicon controlled rectifier 5 too short so that the turn-off time of the silicon controlled rectifier 5 is not satisfied, thereby rendering the turn-off of the silicon controlled rectifier 5 difficult.

If the choke coil 13 is selected as having a large inductive value to avoid such a drawback, the small amount of charge accumulated in the capacitor 4 and having the opposite polarity could not be recovered within a short time and could not be utilized to generate spark or maintain an ionized condition, thereby lowering the oscillation frequency and rendering it impossible to obtain a spark having a high power output. In addition, the circuit becomes very expensive.

FIG. 2(a) shows another prior art technique which is described in the U.S. Pat. No. 3,665,908. Those circuit elements shown in FIG. 2(a) which are the same as those shown in FIG. 1(a) are designated by the same reference numerals.

In the prior art circuit shown in FIG. 2(a), an ignition transformer 11 is provided with an auxiliary tertiary winding 13 magnetically inductively coupled with a primary winding 12 and a secondary winding 14. The tertiary winding 13 is connected in series with a circuit including a diode 16 and a choke coil 12. The ignition transformer 11 is provided with an intermediate tap 22 which is connected to an anode of a silicon controlled rectifier 5 whose cathode is connected to a negative terminal of a charging and discharging capacitor 4. The silicon controlled rectifier 5 is connected in parallel with a series circuit including the tertiary winding 13, diode 16 and the choke coil 21.

The ignition device shown in FIG. 2(a) will operate as follows. As seen from FIG. 2(b) showing operative wave forms of various circuit elements, if the silicon controlled rectifier 5 is caused to conduct, the charge accumulated in the capacitor 4 is discharged through the primary winding 12 and silicon controlled rectifier 5 into a negative terminal of the capacitor 4. Contrary to the ignition device shown in FIG. 1(a), the ignition device shown in FIG. 2(a) is constructed such that the primary winding 12 and the tertiary winding 13 are wound in polarities shown by large dots 23a and 23b, so that the voltages induced in the primary winding 12 and tertiary winding 13 are directed in the same direction. As a result, the forwardly conductive voltage at the silicon controlled rectifier 5 and the diode 16 produced in the tertiary winding 13 within a period between a time $t_o$ and a time $t_1$ causes the shortcircuit current $i_s$ to flow. But, the shortcircuit current $i_s$ does not flow within a time between $t_1$ and $t_2$. Thus, the charge on the capacitor 4 becomes reversed and the capacitor is charged in the opposite direction at the time $t_2$. After the time $t_2$, the capacitor 4 tends to return to its original condition, and as a result, a current is caused to flow through the silicon controlled rectifier 5 in the opposite direction at a time $t_3$ and at the same time flows through the choke coil 21, thereby applying a voltage to the silicon controlled rectifier 5 in an opposite direction. The ignition device, therefore, has the advantage that it is possible to turn off the silicon controlled rectifier 5 in an easy manner. The ignition device, however, has the following drawbacks. In the first place, the shortcircuit current $i_s$ becomes very large, so that a current whose value is larger than that desired for the silicon controlled rectifier 5 instantaneously flows therethrough, and there is a risk of the silicon controlled rectifier 5 being broken down and it accumulates excessive heat. Secondly, at the time $t_3$ a large current and high voltage are forced through and applied to the silicon controlled rectifier 5 causing a premature turnoff of the silicon controlled rectifier 5, thereby accumulating heat therein. Finally, in order to obviate such drawbacks, if the choke coil 21 is selected having a large inductance, as in the case of the ignition device shown in FIG. 1(a), the oscillation frequency becomes lower and at the same time the spark power output is decreased and the ignition device becomes expensive.

SUMMARY OF THE INVENTION

This invention relates to an ignition device for oil burners which comprises an ignition transformer including a tertiary winding, and which can generate a tongue-shaped spark with a reduced loss and a high power output.

The invention provides an ignition device for oil burners, which makes use of a tertiary winding magnetically coupled with primary and secondary windings of an ignition transformer and wound with a polarity which is different from a polarity used in the conventional ignition device. The invention is capable of preventing a switching loss caused by a surplus opposite voltage applied when a silicon controlled rectifier is restored in its opposite direction or preventing the silicon controlled rectifier from excess heating, and is further capable of effecting continuous operation of the ignition device for a long time period.

In addition, heretofore, it has been the common practice to provide a choke coil having a large inductance for the purpose of limiting a large shortcircuit current flowing through the tertiary winding. In the ignition device according to the invention, however, the shortcircuit current becomes a difference voltage between the primary induced voltage and the tertiary induced voltage and hence is small, thereby necessitating no choke coil for the tertiary winding.

During the operation of the ignition device, when the spark, that is, the load is absent, the induced voltages in the primary and tertiary windings are increased. Even in this case, the ignition device according to the present invention makes use of the shortcircuit current caused by the difference between the two induced voltage in the primary and tertiary winding so that substantially no heat is accumulated in the silicon controlled rectifier.

An object of the invention, therefore, is to provide a semiconductor ignition device which can eliminate the above mentioned drawbacks which have been encountered with the prior art ignition devices, and which can be used as an ignition device for oil burners.

DESCRIPTION OF THE PREFERRED EMBODIMENT

Figure 1A:
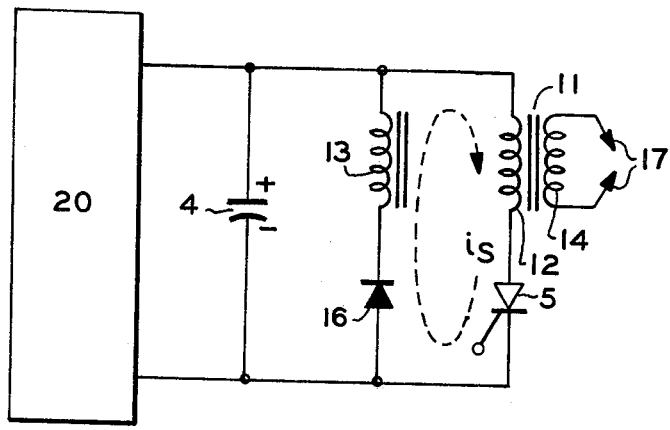
FIG. 1(a) is a schematic connection diagram of a circuit of a prior art ignition device.
Figure 1B:
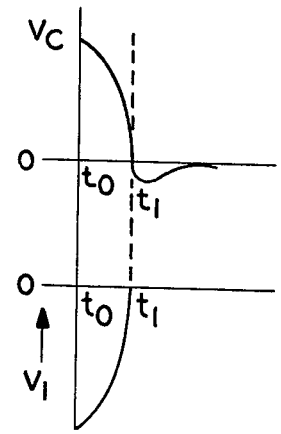
FIG. 1(b) is a voltage wave form diagram of various circuit elements of the circuit shown in FIG. 1(a)
Figure 2A:
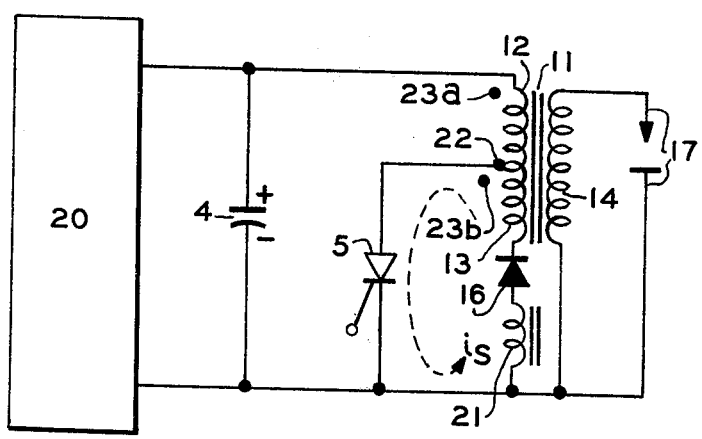
FIG. 2(a) is a schematic connection diagram of a circuit of another prior art ignition device.
Figure 2B:
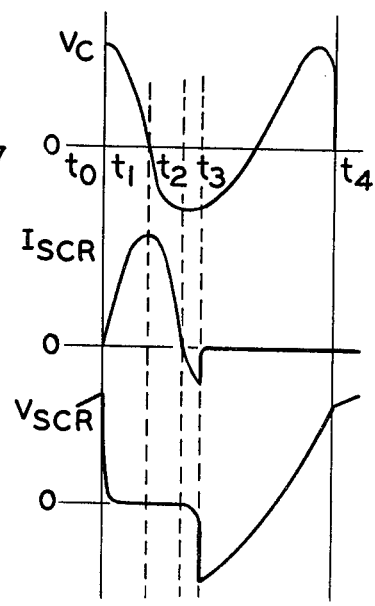
FIG. 2(b) are current and voltage wave form diagrams of various circuit elements of the circuit shown in FIG. 2(a)
Figure 3:
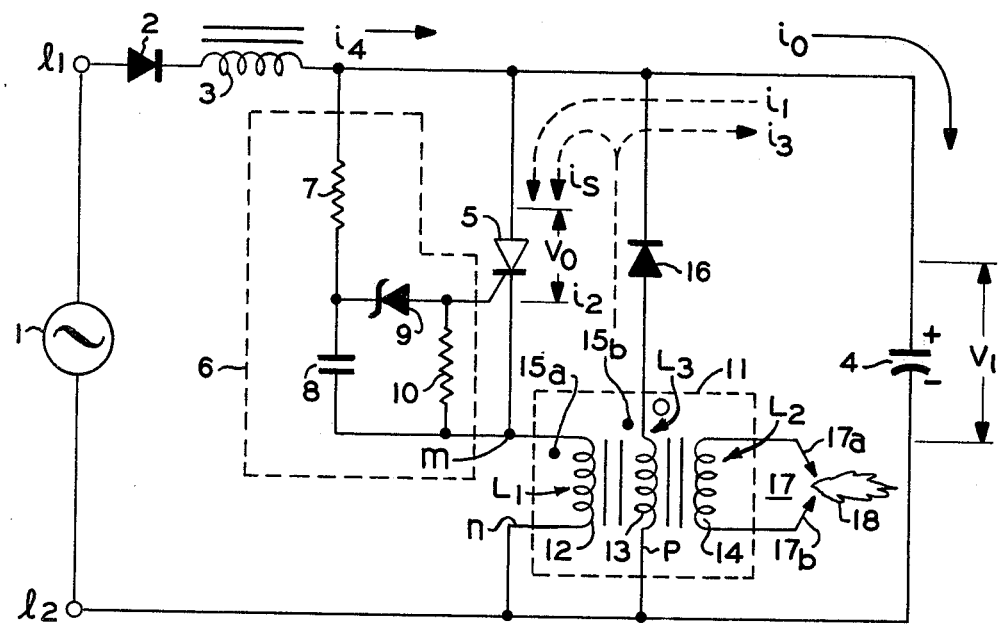
FIG. 3 is a schematic connection diagram of a circuit of an ignition device for oil burners according to the present invention.

FIG. 3 shows a circuit connection diagram of one embodiment of an ignition device according to the invention. Referring to FIG. 3, reference numeral 1 designates an alternating current source which is usually a commercial electric source of 60 hertz at 120 volts. The alternating current is supplied from the electric source 1 through a diode 2 and a choke coil 3 to a charging and discharging capacitor 4. Across the capacitor 4 is connected a series circuit including a silicon controlled rectifier 5 and primary winding 12 of an ignition transformer 11. A further series circuit including an auxiliary tertiary winding 13 of the ignition transformer 11 and a diode 16 are also connected across capacitor 4. An anode terminal of the silicon controlled rectifier 5 is connected to a positive terminal of the charging and discharging capacitor 4 along with a cathode terminal of the diode 16. The ignition transformer 11 is further provided with a secondary winding 14 coupled to spark electrodes 17a and 17b. The primary winding 12, secondary winding 14, and the tertiary winding of the ignition transformer 11 are magnetically coupled with each other. The primary winding 12 and the tertiary winding 13 are wound such that the mutually induced electromotive forces have polarities shown by dots 15a and 15b and are bifilarly wound so as the establish a given degree of magnetic coupling therebetween. Particularly, the number of turns of the tertiary winding 13 is made larger than that of the primary winding 12 so that the inductance of the tertiary winding 13 is more or less larger than that of the primary winding 12. In FIG. 3, reference numeral 6 designates a gating circuit composed of a time constant circuit including a resistor 7 and a capacitor 8. In parallel with the capacitor 8 is connected a series circuit including a Zener diode 9 and resistor 10. A junction point between the Zener diode 9 and the resistor 10 is connected to a gate of the silicon controlled rectifier 5. If the gate trigger voltage of the silicon controlled rectifier 5 is uniform, the Zener diode 9 may be omitted.

The operation of the ignition circuit constructed as above described will now be described with reference to FIGS. 4(a), 4(b) and 5.

Figure 4A:
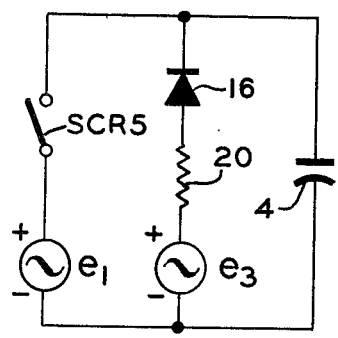
FIGS. 4(a) and 4(b) are equivalent circuits at different operating time of the device shown in FIG. 3.
Figure 4B:
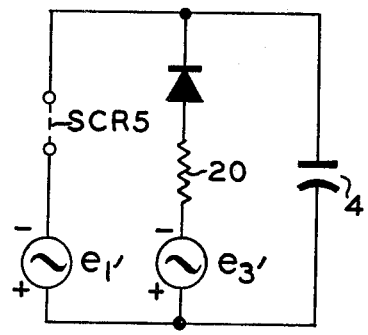
Figure 5:
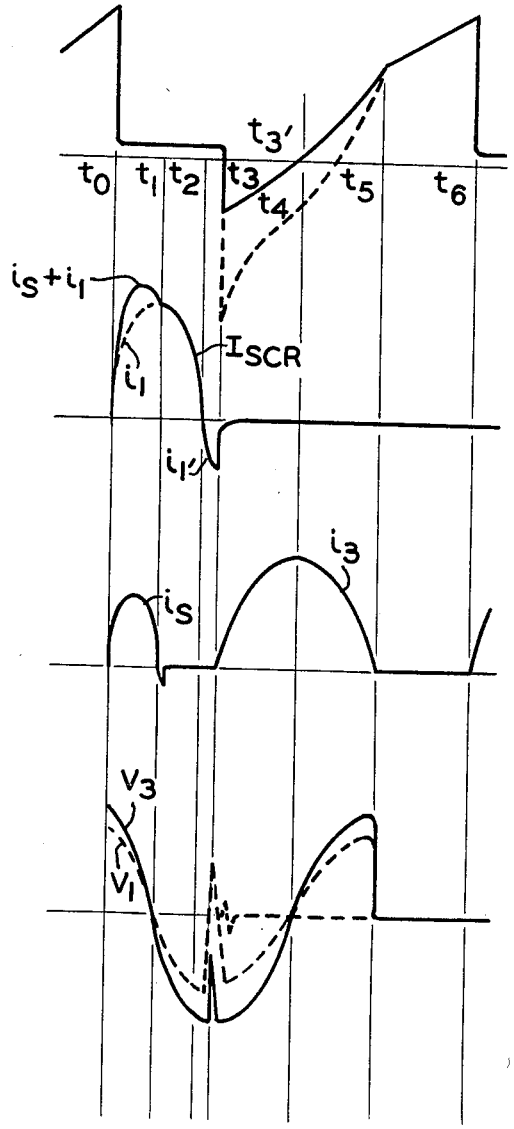
FIG. 5 are voltage and current wave form diagrams of various circuit elements of the circuit shown in FIG. 3.

FIGS. 4(a) and 4(b) show equivalent circuits at given times of the ignition device shown in FIG. 3. FIG. 5 shows current and voltage wave forms at various circuit elements during an operating period of one cycle of the ignition device shown in FIG. 3. The diode 2 functions to cause the ignition device shown in FIG. 3 to effect its oscillating operation during a period when the voltage of the alternating current source 1 becomes a positive half cycle at a terminal $l_1$ in place of at a terminal $l_2$. When the voltage of the alternating current source 1 is in its negative half cycle with respect to terminal $l_1$, the ignition device becomes inactive, thereby generating no spark.

In the positive half cycle, a charging current $i_o$ flows through the diode 2 and current limiting choke coil 3 to the charging and discharging capacitor 4. At the same time, a charging current flows through the resistor 7, capacitor 8 and primary winding 12 to charge the capacitor 8. Since the capacitor 4 is charged earlier than the charging of the capacitor 8, the capacitor 4 is sufficiently charged when the silicon controlled rectifier 5 receives at its gate a given input. If the silicon controlled rectifier 5 is caused to conduct at a time $t_o$, the charging and discharging capacitor 4 begins to discharge through the silicon controlled rectifier 5 and primary winding 12. As a result, as shown in FIGS. 5(i) and 5(ii), a voltage $V_o$ between the anode and cathode of the silicon controlled rectifier 5 is kept at substantially zero for a period between $t_o$ and $t_2$, and an anode current $i_1$ produces a pulse of current. During this time, a high voltage is generated at the secondary winding 14 magnetically coupled with the primary winding 12, thereby generating spark between the electrodes 17a and 17b. During the discharging period from $t_o$ to $t_2$, particularly $t_o$ to $t_1$, a positive voltage $e_1$ is generated at a terminal o of the tertiary winding 13 in place of the other terminal p. FIG. 4(a) shows the above mentioned condition. The positive induced voltage $e_3$ is designed somewhat higher than the positive voltage $e_1$, so that a difference voltage of $e_o = e_e - e_1$ is applied between the anode and the cathode of the silicon controlled rectifier 5. As a result, a current $I_{SCR}$, which is the sum of the discharging current $i_1$ and the shortcircuit current $i_s$, flows the silicon controlled rectifier 5. Since the difference voltage $e_o$ can be designed to any selected value, it is possible to prevent the breakdown of the silicon controlled rectifier 5, and to reduce heat accumulated therein by adjusting the current $I_{SCR}$ that is flowing in the silicon controlled rectifier 5.

At a time between $t_1$ and $t_2$, the difference voltage $e_o$ is apppplied in an opposite direction to the voltage to the silicon controlled rectifier 5 and diode 16, so that no shortcircuit current $i_s$ flows. After the time $t_2$, the opposite direction charge accumulated in the capacitor 4 causes an opposite direction current $i'_1$ to flow through the silicon controlled rectifier 5 during a time within which the silicon controlled rectifier 5 is restored in the opposite direction.

As seen from an equivalent circuit shown in FIG. 4(b), the primary winding 12 and tertiary winding 13 have induced voltages $e'_1$ and $e_3$ which are opposite in direction to the induced voltages $e_1$ and $e_3$, respectively. A difference voltage $e'_o = e'_3 - e'_1$ functions to apply an opposite direction voltage to the silicon controlled rectifier 5. As seen from FIG. 5(i), in the conventional ignition device (as shown by dotted lines), the opposite direction voltage at the time $t_3$ is very large, while in the present embodiment, the difference voltage $e'_o$ is controlled to a small value.

Heretofore, it has been the common practice to instantaneously apply a high opposite direction current and voltage to the silicon controlled rectifier to interrupt its conduction, and the silicon controlled rectifier becomes rapidly heated. Some provision must be made in such prior art devices, such as a large heat sink or a like means, to dissipate the heat. It is therefore difficult to continuously operate the prior art ignition devices for a long period of time. As seen from the above, the present invention can eliminate this difficult problem. In addition, the silicon controlled rectifier tends to delay its turn-off time when the semiconductor junction is heated, and as a result, it is necessary to adjust the value of the opposite direction voltage to be applied to the silicon controlled rectifier. The present invention can also satisfy this requirement.

If the silicon controlled rectifier 5 is turned off at a time $t'_3$, substantially all of the charge accumulated in the charging and discharging capacitor 4 in the opposite direction is returned through the tertiary winding 13 and diode 16 to the charging and discharging capacitor 4 and is recovered. The pulse current $i_3$ between $t_3$ and $t_5$ shown in FIG. 5 (iii) illustrates the above mentioned mode of operation. This pulse of current $i_3$ at the communication time functions to generate in the seconary winding 14 a high voltage which serves to maintain the ionized condition of the air caused by the spark produced during the discharging period between $t_o$ and $t_1$, thereby sustaining the spark for a longer time.

After the $t_5$, at which time the recovery of the residual energy of the charging and discharging capacitor 4 has been completed, the charge is supplemented from the electric source 1 through the choke coil 3. At a time $t_6$, the next oscillating operation is started. This one operation is repeatd at an oscillating frequency of substantially 10 kilohertz.

In the prior art ignition devices for internal combustion engines, use is made of the direct current-direct current converter 20 to supply the large pulse current to the charging and discharging capacitor 4 to charge it. At the time $t_3$ at which time the silicon controlled rectifier 5 is charged in its opposite direction, a large pulse current is supplied to the converter 20, and as a result, there is a risk of the silicon controlled rectifier 5 failing in its turn-off operation. This drawback can be eliminated by adjusting the turn-off of the pulse current. In the present invention, the ignition device is used for oil burners, so that the timing of the pulse current can be adjusted by the choke coil 3. After the time $t_2$, the residual energy remained in the charging and discharging capacitor 4 tends to be recovered through the electric source 1 and diode 2. But, at the time $t_3$, this commutation current would cause the silicon controlled rectifier 5 to fail in its turn-off operation. In this case, the choke coil 3 functions to restrict the increase of the transient current, so that the choke coil 3 plays an important role in the ignition device for oil burners.

The constants of the circuit elements used for the ignition device of the embodiment of FIG. 3 are as follows:

| Element | Reference Numeral | Value of Type |
|---|---|---|
| Diode | 2 | R51A |
| Choke coil | 3 | 150 millihenries |
| Capacitor | 4 | 0.1 microfarad |
| Silicon Controlled Rectifier | 5 | CR2AM-8 |
| Ignition Transformer | 11 | Primary-80 turns, 260 microhenries, 0.26 ohms (D.C.) Secondary - 7200 turns Tertiary - 85 turns, 300 microhenries, 0.83 ohms (D.C.) |
| Resistor | 7 | 50,000 ohms |
| Capacitor | 8 | 0.1 microfarad |
| Resistor | 10 | 500 ohms |

The embodiments of the invention in which an exclusive property or right is claimed are defined as follows:

1. An ignition device for oil burners, comprising: a capacitor adapted to be connected to a source of alternating current through a choke coil to allow for the storage of electrical energy in said capacitor; transformer means having a primary winding, a step-up secondary winding, and a tertiary winding with the same magnetic polarity as said primary winding and which is magnetically coupled to said primary winding; said tertiary winding being coupled to said primary winding so that an electromotive force mutually induced in said tertiary winding is higher than and counter balanced with an electromotive force induced in said primary winding; a silicon controlled rectifier connected to said capacitor and in series circuit with said primary winding to control the discharge of said stored energy through said primary winding to induce a high voltage in said secondary winding which is in turn adapted to produce oil ignition sparks across a pair of electrodes; said silicon controlled rectifier including gate means to periodically gate said silicon controlled rectifier into conduction; and said tertiary winding being connected through a commutating diode to said capacitor with an output from said tertiary winding being supplied to said silicon controlled rectifier and said primary winding.

2. An ignition device for oil burners as described in claim 1 wherein said gate means includes a capacitor to store a gating potential for said silicon controlled rectifier.

3. An ignition device for oil burners as described in claim 2 further comprising a diode in series circuit with said choke coil between said source and said first capacitor to cause said first capacitor to store energy on only one half cycle of said alternating current source.

* * * * *